United States Patent [19]
Mosher, Jr.

[11] Patent Number: 5,973,600
[45] Date of Patent: Oct. 26, 1999

[54] LAMINATED RADIO FREQUENCY IDENTIFICATION DEVICE

[75] Inventor: Walter W. Mosher, Jr., West Hills, Calif.

[73] Assignee: Precision Dynamics Corporation, San Fernando, Calif.

[21] Appl. No.: 09/149,984

[22] Filed: Sep. 9, 1998

Related U.S. Application Data

[60] Provisional application No. 60/058,653, Sep. 11, 1997.

[51] Int. Cl.[6] .................................................. G08B 13/181
[52] U.S. Cl. ..................... 340/572.8; 340/572.1; 340/573.1; 340/573.4
[58] Field of Search .............................. 340/572.1, 572.4, 340/572.8, 573.4, 573.1

[56] References Cited

U.S. PATENT DOCUMENTS 4,598,275  7/1986  Ross et al. ............................ 340/573.4
5,646,592  7/1997  Tuttle .................................... 340/572.1

Primary Examiner—Glen Swann
Attorney, Agent, or Firm—Thomas P. Mahoney

[57] ABSTRACT

An RFID wristband incorporates identification circuitry which may be of a read only, a read/write, a passive, or an active configuration. The wristband consists of a plurality of laminae which bear components of the RFID circuitry and which encapsulate said circuitry upon the securement or adherence of said laminae to each or one another. The wristband is incorporated in an identification system particularly adapted for hospital patient identification and is associated with an RFID reader which generates a magnetic signal requesting identification from the wristband. The wristband is automatically assembled by the utilization of at least two laminae of a polymorphic flexible nature to encapsulate the RFID circuit and includes the utilization of polymeric in conductive components in said circuit. The method of assembling the RFID components with the respective laminae results in the complete isolation of the RFID circuit from contact with deleterious and corrosive substances characteristic of hospital environments.

15 Claims, 5 Drawing Sheets

LAMINATED RADIO FREQUENCY IDENTIFICATION DEVICE

This application claims the benefit of U.S. Provisional Application No. 60/058,653 filed Sep. 11, 1997.

This invention relates to a radio frequency identification device (RFID) which is laminated from a plurality of laminae in a continuous process and which is exemplified by the utilization of the resulting laminate in an RFID wristband or the like. Such wristbands are commonly utilized in the identification of individuals and the transmission of relevant information pertaining to said individuals to a receiver which may be a hand-held receiver or a master receiving and transmitting station. The RF circuitry is incorporated between the laminae during assembly of the laminae into a laminate and, as will be disclosed in greater detail below, the resulting laminated RF wristband is produced more efficiently and functions more effectively than conventional RFID tags.

BACKGROUND OF THE INVENTION

At the present time, identification devices, such as wristbands or the like, are widely used in hospitals or in crowd control situations, such as concerts, amusement parks, or the like, to identify patients or individuals and provide information regarding patients or individuals. In addition, such wristbands may be utilized in penal and similar institutions for the purpose of inmate control.

Initially, such wristbands were confined to providing the bare minimum of the patient's name and, possibly, of the patient's illness. In crowd control situations, the wristband was utilized to indicate the admissibility of the individual wearing the band and, frequently, the duration, by color indication, of the attendance period of the person wearing the wristband.

Recently, identification wristbands have been provided with encoded information in the form of bar codes or the like whereby considerable additional information about the individual wearing the wristband can be ascertained, including, in the case of a hospital patient, relevant data such as medication, the patient's condition, or the like.

In crowd control situations, the wristbands can be utilized to provide such data as the amount of money or payments unexpended by the individual wearing the wristband.

Thus, in amusement parks or the like, the wristband, by the use of encoded information, can control the admission of the individual wearing the band to specific attractions. As each attraction is assessed against the wristband, the sum of money remaining for expenditures is reduced.

In utilizing such wristbands, various types of bar code readers are provided to the relevant staff which read the bar codes to determine, in case of patient care, therapeutic measures, such as administering medication or various other services for the patient. In the case of crowd control, such as in amusement parks, the reader charges the wristband for the entry to the specific attraction desired by the wristband wearer.

While the use of bar codes or other encoded materials has constituted a considerable advance over prior imprinted information, once the bar code has been applied to the identification wristband, particularly in the case of a hospital patient, alteration of the information on the wristband entails the substitution of a new or companion band. In addition, because of physical limitations, the information imparted by bar codes or the like is necessarily limited.

A possible solution which would overcome the limitations of identification wristbands which are bar-coded or provided with similar encoded imprinted material would be to provide an RF circuit in the wristband which would incorporate a semi-conductor circuit with logic, memory, and an RF circuit connected to an antenna capable of storing and dispensing information so that a staff member carrying a transponder could query the RF circuit of the wristband to elicit a wide spectrum of information not presently available in conventional wristbands.

Unfortunately, available RF circuits are relatively expensive and, since conventional wristbands are disposable after use, such circuits would have to be discarded if they were integral components of the wristband.

OBJECTS AND ADVANTAGES OF THE INVENTION

An object of the invention is the provision of a wristband fabricated from a laminate consisting of at least two laminae and, preferably, three laminae wherein a tag incorporating an RF circuit is provided on one or more of the laminae which are formed from flexible materials such as polyester and low-density polyethylene.

The respective laminae, therefore, constitute a flexible substrate for the tag which will, thus, be readily secured to the wrist of an individual utilizing the laminated wristband.

Another object of my invention is the provision of an RF wristband which is constituted by three laminae, namely, a center lamina formed from polyester sheet material and two outer upper and lower laminae fabricated from low-density polyethylene sheet materials or any suitable material that can be laminated.

Obviously, there are numerous methods by which the sheet materials can be utilized as laminae secured to one another to provide the resulting laminate. One of the most efficient methods involves the feeding of the polyester center lamina as the initial lamina.

Another object of my invention is the provision of an article, such as a laminated wristband, wherein a plurality of tags are secured to a surface of the center laminate prior to the subsequent assemblage of the second and third upper and lower polyethylene laminae with the center lamina.

A further object of my invention includes the concept of temporarily securing the aforesaid tags in spaced relationship on the center lamina, said securement being merely sufficient to locate and retain the tags on the center lamina prior to the assemblage process.

A further object of my invention is the provision of a wristband in which the retention of the aforesaid tags in a predetermined relationship with the wristband is accomplished by the process of adhering the upper or lower lamina to the center lamina so that the tag is retained in a predetermined secure position in the wristband and no further means of securement of the tag is necessary.

An additional object of my invention is the method of securing a plurality of tags in spaced relationship on one of the lamina wherein the adherence of the tags prior to lamination is merely sufficient to retain the tags in operative relationship with the lamina during the lamination process and the actual securement of the tags occurs when the ultimate lamination of the plurality of laminae occurs.

Another object of my invention is a method of assembling a plurality of tags in operative, spaced relationship with the laminae of a laminate during the assemblage of the laminae of the laminate by inserting said tags between the respective laminae during the securement of the laminae to one another.

Another object of my invention includes the step of depositing various components of the RF circuit on the laminae prior to or during the laminating process. Such deposition can be accomplished by various types of conductive or semi-conductive or non-conductive inks or conductive polymers to build the necessary RF circuitry.

A related object of the invention is the provision of a wristband wherein one or more of the laminae incorporate printed circuitry.

An additional object of the invention is the provision of a wristband in which the various elements of an RF circuit can be assembled on one of the laminae of a laminated wristband prior to the securement of all of the laminae to one another.

Other objects and advantages of the invention will be apparent from the following specification and the accompanying drawings which are for the purpose of illustration only.

PREFERRED EMBODIMENTS OF THE INVENTION

LAMINATED WRISTBANDS

Figure 1:
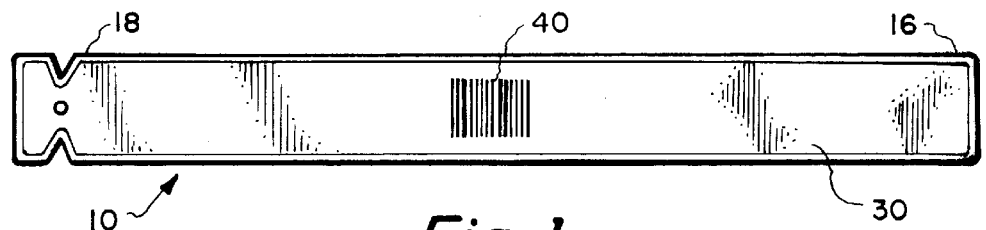
FIG. 1 is a top plan view of a laminated wristband.
Figures 2, 3:
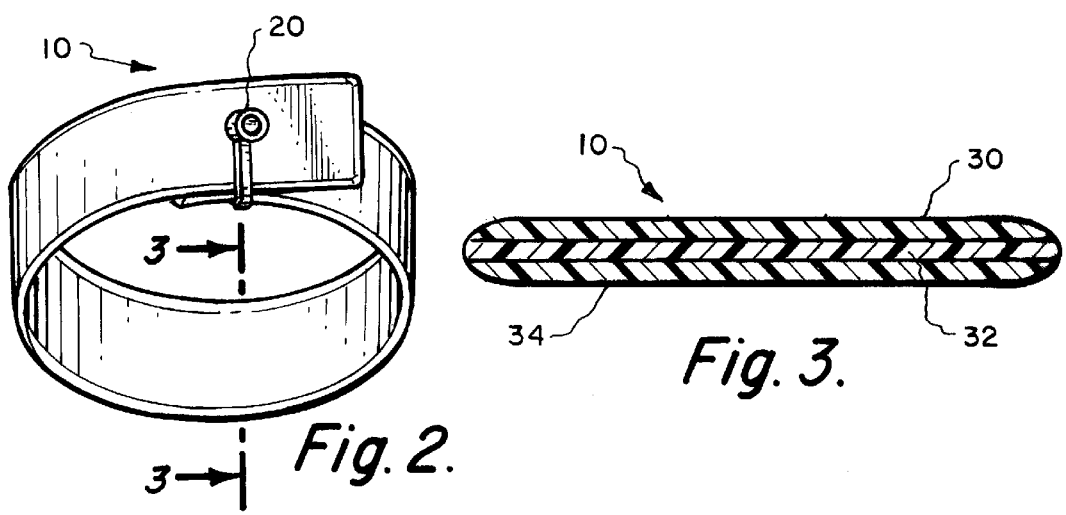
FIG. 2 is an isometric view of the wristband in the closed position which it assumes about the wrist of a wearer or other object to be identified.
FIG. 3 is a vertical sectional view taken on the broken line 3—3 of FIG. 2.

Referring to the drawings, and particularly to FIGS. 1–3 thereof, I show a laminated wristband 10 whose opposite extremities 16 and 18 are maintained in operative relationship with each other about an object to be identified, such as the wrist of a hospital patient, as best shown in FIG. 2 by means of a fastener 20. The fastener 20 and its relationship with the wristband 10 are disclosed in U.S. Pat. No. 5,448, 846 and reference is made to said patent for the operation and construction of said fastener.

The wristband 10 is a tri-laminate wristband, as best shown in FIG. 3 of the drawings. It includes a top lamina 30, an intermediate lamina 32, and a bottom lamina 34. The laminae may be fabricated from a wide variety of sheet materials such as polyester, low-density polyethylene and the like. In this case, the top and bottom laminae 30 and 34 are fabricated from low-density polyethylene and the intermediate or middle lamina 32 is fabricated from polyester resin.

There is a wide variety of methods of fabricating laminated wristbands such as the wristband 10, but the preferred method is providing rolls of sheet plastic material which are dispensed synchronously and are ultimately secured to one another by glue or other expedients. In the manufacture of the wristband 10, the intermediate lamina 32 is initially dispensed from its roll and the top and bottom laminae 30 and 34 are subsequently secured thereto. After being so secured, the laminated sheets are subjected to the formation of a plurality of wristbands by the utilization of scoring dies or the like.

As the resulting laminate issues from the lamination site, it is rolled upon a collection roll from which it is subsequently dispensed to permit the severance of the wristbands from one another. In some cases, the wristbands are permitted to remain in sheet form, roll form, or individual sheets and are shipped to the ultimate user in that configuration.

Conventionally, when an identification wristband is prepared for application to, let us say, the wrist of a hospital patient, the basic information about the patient, namely, his name, hospital identification number, and the like, are imprinted upon the top lamina and a bar code 40 is also imprinted upon the top lamina 30 which contains other relevant but limited information relating to the patient.

Once the wristband 10 is installed on the wrist of a patient, the imprinted information on the top lamina 30 is consulted by the nurse or other attendant ministering to the needs of the patient. Anyone familiar with present-day hospital procedures has observed that the imprinted materials on the upper lamina 30 of the wristband 10 are, frequently, hard to read and partially obliterated due to frequent handling during the patient's stay in the hospital. Additionally, visual comparisons are frequently hurriedly made in dim light and confined quarters all contributing to the possibility of mistakes upon the part of the attendants.

In addition to tri-laminate wristbands like the wristband 10 of FIGS. 1–3, bi-laminate wristbands are provided which are frequently manufactured from vinyl sheet material or the like with the wristband configurations being incorporated in the sheets by heat stamping or the like. It is possible to incorporate the teachings of the invention in bi-laminate wristbands, but the use of tri-laminate wristbands is preferred because of the increased strength of the tri-laminate wristbands and various other structural and operative advantages thereof over bi-laminate wristbands.

LAMINATED WRISTBAND/RFID CIRCUITRY ASSEMBLY

Figure 4:
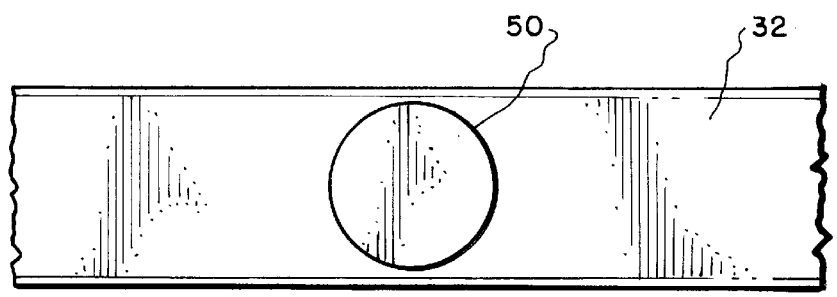
FIG. 4 is an enlarged fragmentary plan view showing an RFID tag mounted on one of the laminae of the multi-laminae wristband such as that of FIGS. 1–3.

The broad concept of the invention is that one or more laminae will have one or more components of an RFID circuit assembled thereupon or imprinted thereupon or connected thereto during the fabrication of the wristband by the securement of the respective top, intermediate, and bottom laminae to one another. For instance, the assemblage of a totally pre-fabricated tag 50 is shown in FIG. 4 of the drawings with the tag 50 being secured to the intermediate lamina 32 of the wristband 10.

Figure 5:
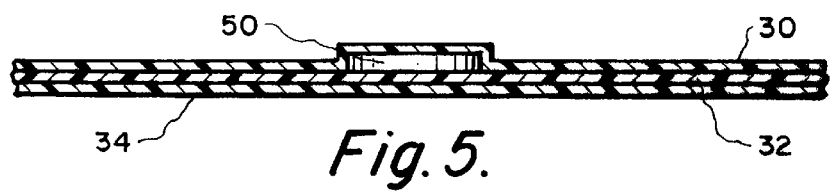
FIG. 5 is a longitudinal sectional view showing the utilization of two laminae to mount and locate the RFID tag of FIG. 4.

The temporary securement of the tag 50 to the upper or lower surface of the intermediate lamina 32 is accomplished prior to the initiation of the assembly process for the laminae of the wristband 10. One or more tags 50 are temporarily secured to the upper or lower surface of the intermediate lamina 32 by a dot of glue or the like, since the intent is not to achieve permanent securement of the tag 50 to the respective surface of the lamina 32 but merely to insure that the tags 50 will be carried on the intermediate lamina 32 to the point at which the tags 50 can be enshrouded in the desired location on the intermediate lamina 32 by the overlying top lamina 30 or, conversely, the bottom lamina 34, as illustrated in FIG. 5 of the drawings. This method of assembly relies upon the permanent location of the tag 50 in the wristband 10 by the action of the respective upper or lower lamina 30 or 34 as it is secured to the intermediate laminate 32 upon which the tag 50 has been previously deposited.

In another assembly method, the tag 50 is deposited on the intermediate lamina 32 immediately prior to the assemblage of the top lamina 30 with said intermediate lamina.

The deposition of the tags 50 on the intermediate lamina 32 can be accomplished by automatic dispensing heads located in proximity to the line of traverse of the laminae of the wristband during the assembly process. The deposition of the tags 50 can be accomplished from an overhead, drop-down arrangement or by a transverse shuttle which feeds the tags 50 from the side of the path of movement of the laminae 30, 32, and 34.

In contradistinction to the utilization of a totally integrated RFID circuit, such as the tag 50, it is also possible to provide for the deposition of separate components of the circuit in conjunction with other components which may be imprinted, foil-deposited, wire-deposited, or the like.

Figure 6:
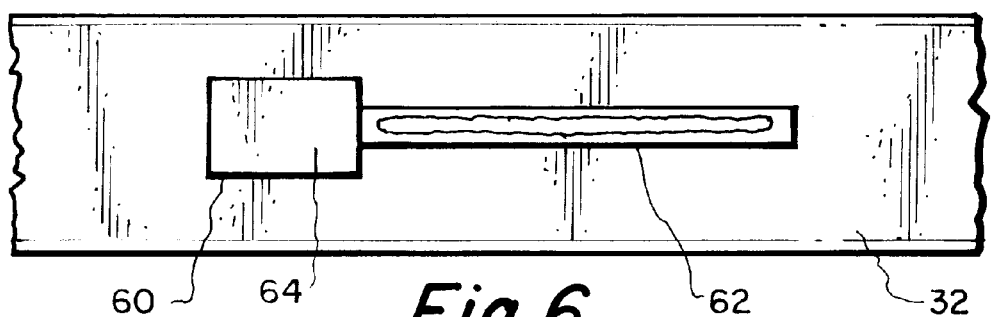
FIG. 6 is a view similar to FIG. 4 but showing an alternative RFID circuit.
Figure 7:
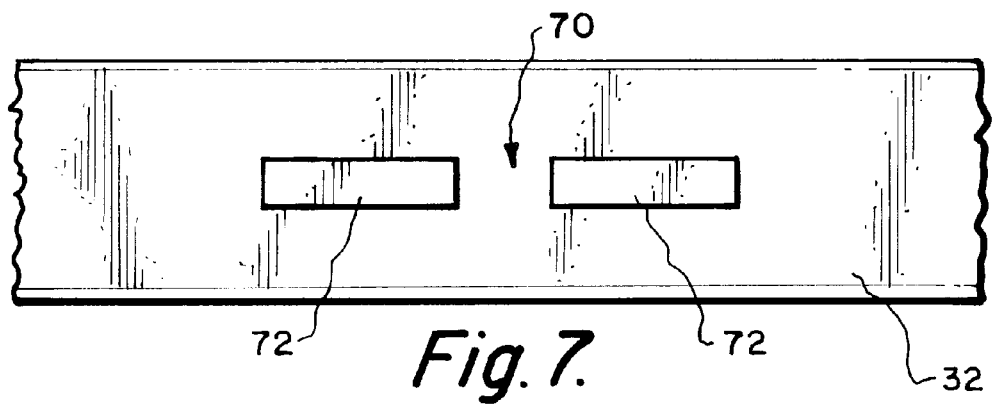
FIG. 7 is a top plan fragmentary view of the center lamina of a tri-laminate wristband with an RFID circuit secured thereto.
Figure 8:
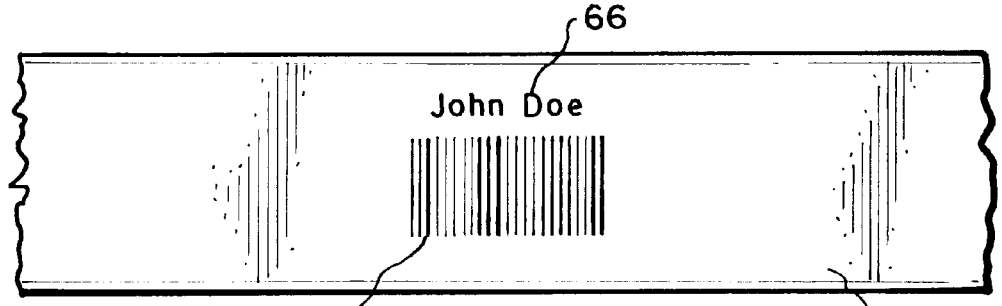
FIG. 8 is a view of the top lamina of said tri-laminate.
Figure 9:
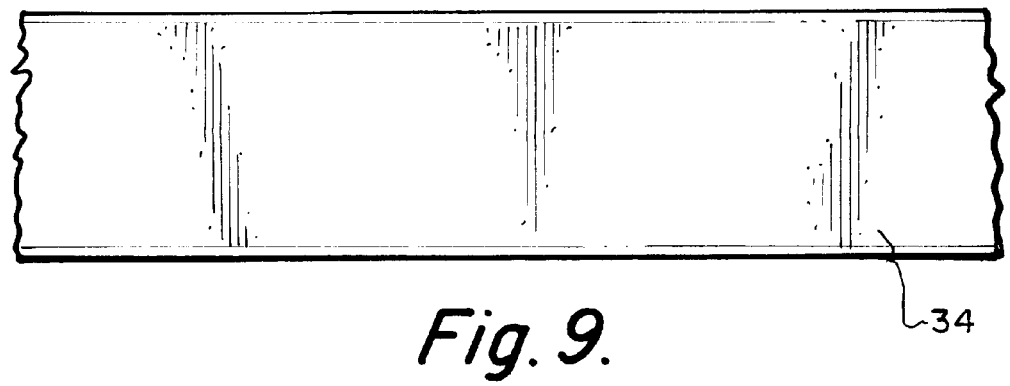
FIG. 9 is a view of the bottom lamina.

Illustrative of the combination of prefabricated RFID circuitry with portions of the RFID circuit which are imprinted or otherwise provided on a surface of the intermediate lamina 32 is the showing of FIG. 6 wherein all of the components 60 of an RFID circuit are provided on a surface of the lamina 32 with a separate antenna 62, said antenna being fabricated from foil or the like or being imprinted upon the surface of the intermediate lamina 32. The antenna is operatively connected to bumps or pads on the housing 64 of the RFID circuitry components.

Once again, the entire assemblage of circuitry 60 and antenna 62 can be accomplished by applying a multiplicity of such combinations to the respective surface of the intermediate lamina 32 prior to the dispensing of the lamina 32 from its roll in conjunction with the upper and lower laminae 30 and 34.

On the other hand, the imprinting of the antenna 62 can be accomplished prior to the assemblage of the respective laminae 30, 32, and 34 with the other RFID components being assembled with the antenna during the assemblage of the laminae 30, 32, and 34.

It is well known to those skilled in the art that RFID circuitry of the type under discussion is provided in a plurality of configurations; for example, read only, read/write, passive, and active. The read only provides previously installed information from the RFID circuit through a compatible reader. The read/write circuit permits the reader to install or alter information stored in the circuit. The passive circuit is one which depends for activation and operating power upon the signal emitted by the reader while the active circuit includes a battery or other internal power source which may be activated by the signal from the reader.

A read/write RFID circuit is disclosed in FIGS. 7–10 of the drawings as including a silicon tag 70 and di-pole antennae 72, said di-pole antennae being fabricated by a wide variety of procedures such as wire implantation, foil securement, conductive ink imprinting, and the like.

Figure 10:
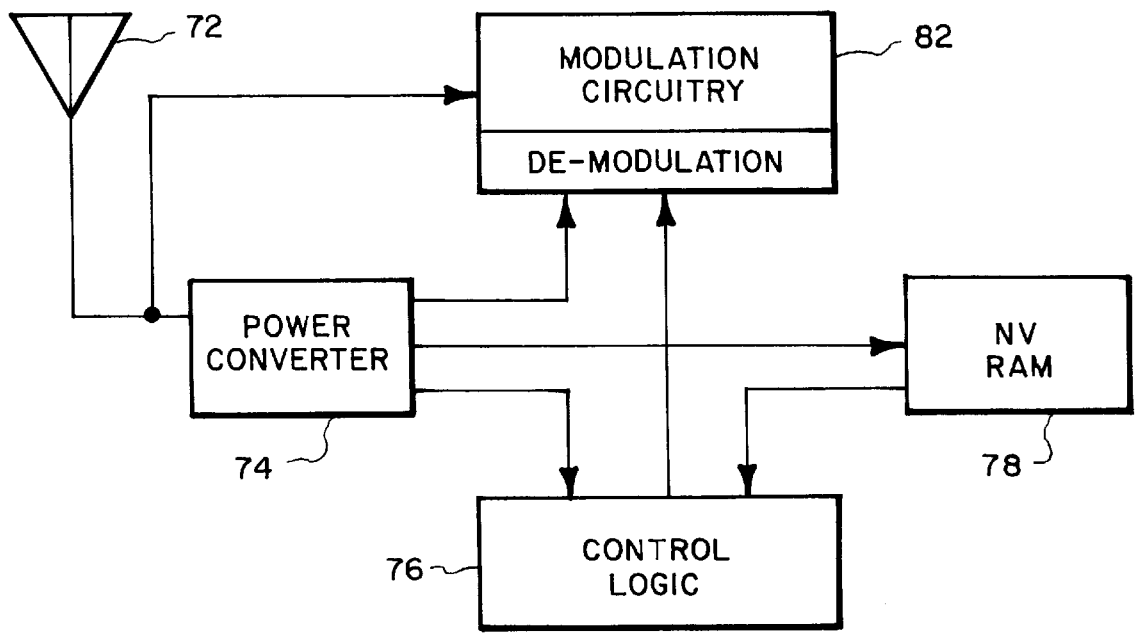
FIG. 10 is a system diagram of the RFID circuit shown in FIG. 7.

The installation of the antennae and associated circuit can be accomplished by various means, equipment, and at the times referred to hereinabove in discussing previous embodiments of the invention. The top lamina 30 has a bar code 65 and additional readable information 66 disposed on the upper surface thereof while the bottom lamina is secured to the underside of the intermediate lamina 32. The read/write RFID circuit is shown in FIG. 10 as including the antennae 72, a power converter 74, control logic 76, NV Ram 78, and de-modulation and modulation circuitry 82.

Figure 13:
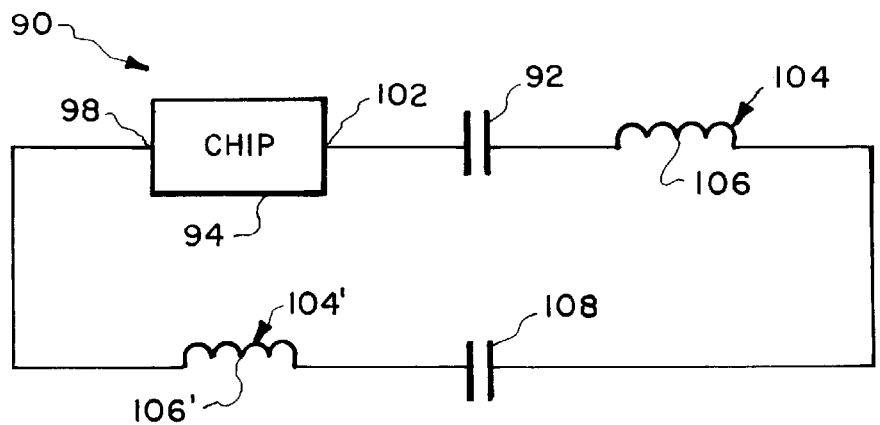
FIG. 13 is circuit diagram of the circuit components shown in FIGS. 11 and 12.
Figure 11:
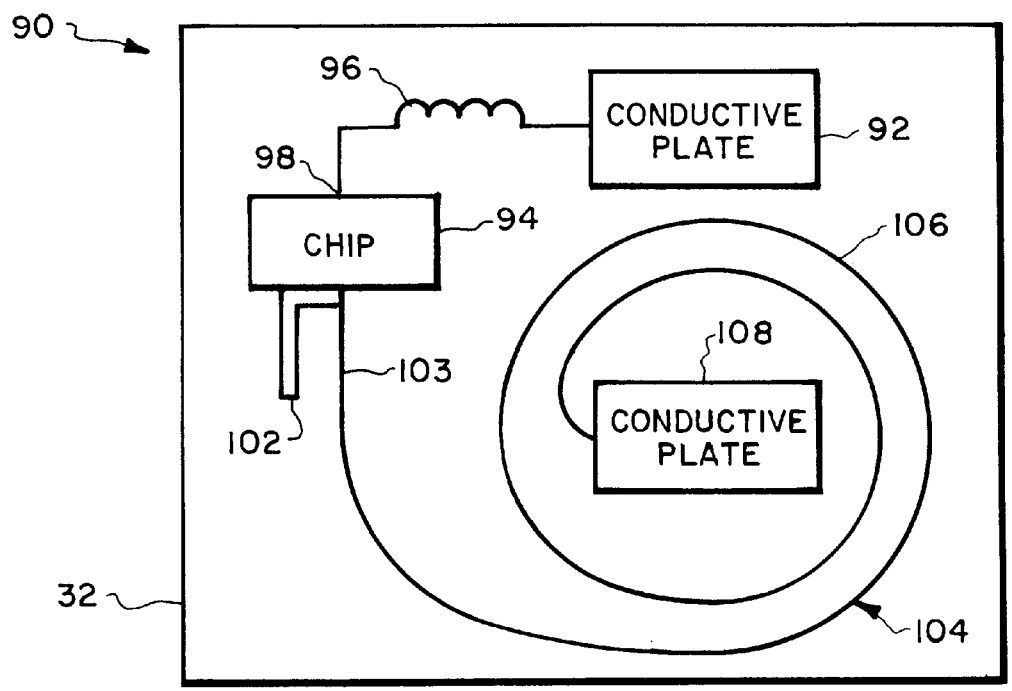
FIG. 11 is a portion of an RFID circuit secured to the top of the intermediate lamina of a tri-laminae wristband.
Figure 12:
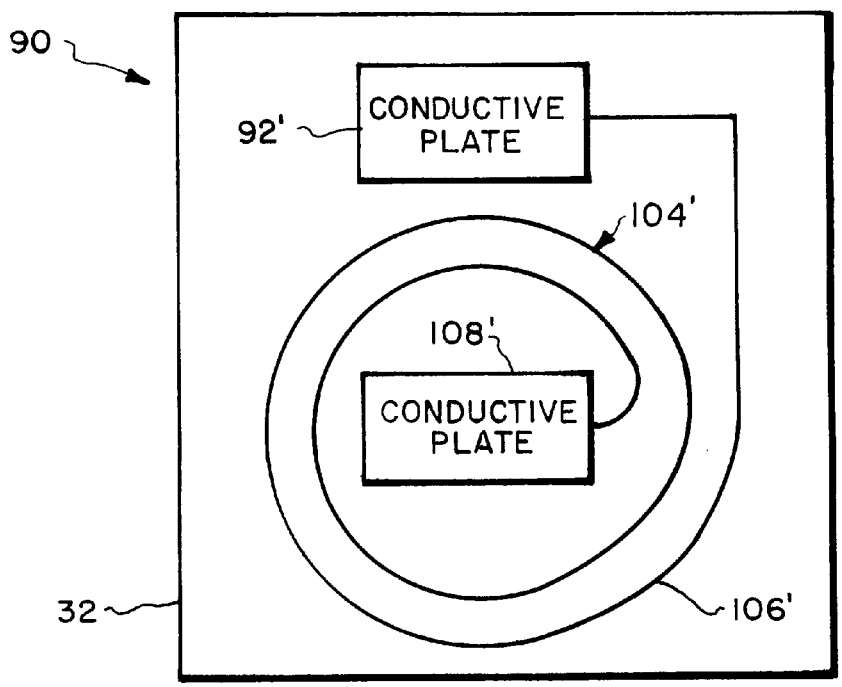
FIG. 12 is a portion of the RFID circuit secured to the underside of the intermediate lamina.

As best shown in FIGS. 11–13 of the drawings, an alternative RFID read/write circuit 90 can be utilized to impart and receive the information which is required of the particular situation that a laminated wristband is capable of providing by the use of an appropriate reader, not shown.

The circuit 90 is intended to be utilized in a tri-laminae wristband and to be installed on the top and bottom surfaces of the intermediate lamina 32. The circuit 90 includes a conductive plate 92 which is applied to the upper surface of the lamina 32 and may be in the form of a foil appliqué, imprint, or the like and functions as one side of a first capacitor circuit. An RFID chip 94 is secured to the upper surface of the lamina 32 in juxtaposition to the plate 92 and is connected thereto by a conductor 96. The chip 94 is electrically connected to the chip terminals 98 and 102 by the utilization of conductive ink, foil, or other means. The electrical connection may be made by conductive adhesive, ultrasonic weld, solder bump, or the like.

The conductor 96 connects the chip terminal 98 to the plate 92 which has a significant surface area and forms one side of a capacitor circuit.

The conductor 103, electrically connected to the terminal 102 of the chip 94, is deposited in a spiral pattern 104 on the top surface of the lamina 32. This spiral pattern forms an inductor coil 106. The other side of the coil 106 is connected to a conductive plate 108 which forms one side of a second capacitor circuit.

Formed on the bottom surface of the lamina 32 in essentially the same manner as the circuit on the top surface of the lamina is a plate 92' which completes the first capacitor circuit with the plate 92 on the top of the lamina 32. The plate 92' is connected at one end of a spiral coil 106' which, in turn, is connected to a plate 108' which establishes the second capacitor circuit with the plate 108.

Consequently, two capacitor circuits are provided: the first circuit constituted by the plates 92 and 92' and the second circuit constituted by the plates 108 and 108'.

When the circuits incorporating the capacitor plates 92/92' and 108/108' are imprinted or otherwise formed upon the upper and lower surfaces of the substrate constituted by the centrally-located lamina 32, they are positioned in overlying relationship with one another so that the aforesaid capacitor circuits may incorporate the dielectric capacity of the plastic material utilized in forming the substrate constituted by the lamina 32.

When the respective components on the top and bottom of the lamina 32 are juxtaposed in the manner suggested hereinabove, they form an electronic circuit connecting the antenna terminals of the RFID chip to a network consisting of two inductors and two capacitors. In this embodiment of the invention, the turns of the top and bottom spirals are wound in the same direction. Consequently, the top and bottom inductor patterns form an inductive antenna to receive and transmit electromagnetic signals to and from an RFID reader.

Shown in FIG. 13 of the drawings is a series resonant L-C circuit 90 electrically connected to the antenna terminals 98 and 102 of the chip 94. Therefore, the circuit, operating with equivalent circuit values corresponding to the dimensions in geometry of the structures on the opposite surfaces of the lamina 32 would be operated at the resonant frequency of the equivalent circuit.

Figure 14:
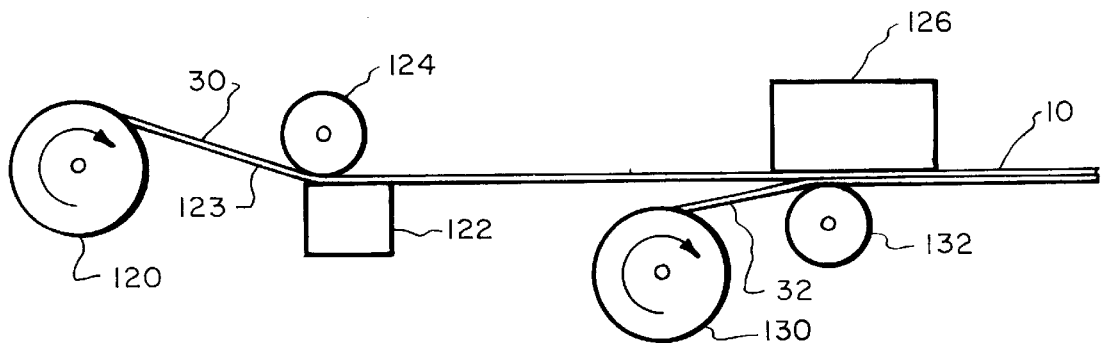
FIG. 14 is a schematic view showing the imprinting and assemblage of a dual-laminae wristband.

A schematic view of the assemblage of an RFID circuit in the bi-laminae wristband is shown in FIG. 14 of the drawings wherein an upper lamina 30 of sheet plastic material is drawn from a dispensing roll 120 between circuit-imprinting means 122 and a back-up roll 124. The circuit-imprinting means 122 may be composed of a plurality of different imprinting devices which result in the formation of a complete circuit. The RFID circuit (not shown) is printed on the underside 123 of the upper lamina 30 and the upper lamina 30 is fed to a laminating station 126 where it is adhesively or otherwise fastened to the lower lamina 32 drawn from a dispensing roll 130. A back-up roll 132 supports the assemblage during the final fabrication of the wristband 10.

Figure 15:
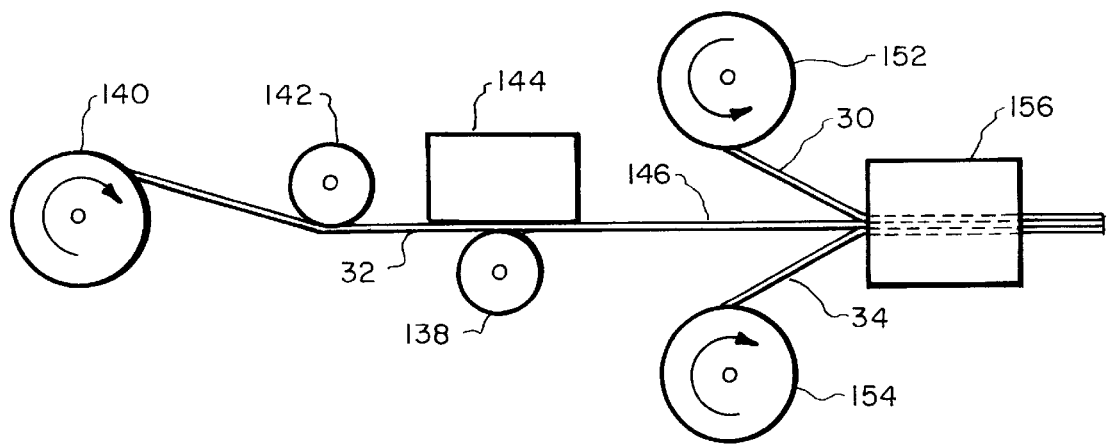
FIG. 15 is a schematic view showing the assemblage of a tri-laminae wristband.

A tri-laminae assembly apparatus is shown schematically in FIG. 15 of the drawings as including a dispensing roll 140 for plastic sheet material for an intermediate lamina 32 which is entrained upon a guide roll 142. An imprinting means 144 imprints the RFID circuitry on the upper surface 146 of the intermediate lamina 32 which is supported during the imprinting process by a back-up roller 138.

If desired, downstream from the imprinting apparatus 144, a supplemental apparatus can be located under the lamina 32 to provide supplemental circuitry to that deposited by the imprinting apparatus 144.

After the imprinting process has been completed, the top lamina 30 and bottom lamina 34 are drawn from supply rolls 152 and 154 into an assembly station 156 where they are sealed into encompassing and encapsulating relationship with the intermediate lamina 32.

Figure 16:
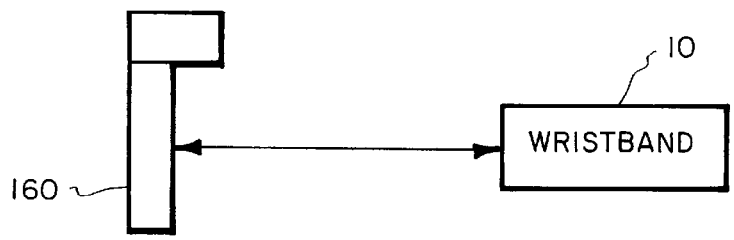
FIG. 16 is a schematic view showing the mutual communication between a reader and the wristband of the invention.

The mutual communication between the RFID reader 160 and the wristband 10 is illustrated in FIG. 16 of the drawings. Initially, the RFID circuitry of the wristband is programmed to provide identifying and other information and the reader is capable of eliciting such information from the RFID circuitry of the wristband. In a read/write configuration of the circuitry of the wristband 10, the reader may also impart information to, alter information on, or delete information from the wristband 10.

Although I have described specific exemplifications of the assemblage and construction of the wristband and of the RFID components associated therewith, it will be obvious to those skilled in the art that alternative configurations may be utilized which will still fall within the scope of the invention.

I claim:

1. In an identification wristband for emitting a radio frequency identification signal, the combination of:
   a first flexible polymer lamina having an outer surface and an inner surface;
   a second flexible polymer lamina having an outer surface and an inner surface;
   programmable encoder circuitry imprinted on the inner surface of one of said laminae for defining identification information;
   an antenna encapsulated between said laminae; and
   signal generator circuitry imprinted on the inner surface of one of said laminae and responsive to said encoder circuitry for applying a radio frequency signal bearing said identification information to said antenna and said laminae being secured to each other to encapsulate said circuitry.

2. In an identification wristband for emitting a radio frequency identification signal, the combination of:
   a first flexible polymer;
   a second flexible polymer;
   programmable encoder circuitry encapsulated between said laminae for defining identification information;
   an antenna encapsulated between said laminae; and
   a signal generator circuitry encapsulated by said laminae and responsive to said encoder circuitry for applying a radio frequency signal bearing said identification information to said antenna formed of polymer materials deposited on one of said laminae.

3. In an identification wristband for emitting a radio frequency identification signal, the combination of:
   a first flexible polymer lamina;
   a second flexible polymer lamina;
   programmable encoder circuitry encapsulated between said laminae for defining identification information;
   an antenna encapsulated between said laminae; and
   a signal generator circuitry encapsulated by said laminae and responsive to said encoder circuitry for applying a radio frequency signal bearing said identification information to said antenna; and
   a third intermediate lamina located between said first and second laminae, said intermediate lamina having said circuitry deposited thereupon in conjunction with said antenna and encapsulated between said first and second laminae.

4. The identification wristband of claim 3 wherein said circuitry is formed of polymeric materials deposited on said third intermediate lamina.

5. In an identification wristband for emitting a radio frequency identification signal, the combination of:
   a first flexible polymer lamina;
   a second flexible polymer lamina;
   programmable encoder circuitry encapsulated between said laminae for defining identification information;
   an antenna encapsulated between said laminae;
   a signal generator circuitry encapsulated by said laminae and responsive to said encoder circuitry for applying a radio frequency signal bearing said identification information to said antenna; and
   said circuitry being embodied in an IC chip deposited on an intermediate third lamina and encapsulated between said first and second laminae.

6. In a system for providing identification information, the combination of:
   a reader for emitting an electromagnetic signal;
   an identification wristband responsive to said electromagnetic signal by producing an identification signal, said wristband including:
   a first lamina of polymeric material having an outer surface and an inner surface;
   a second lamina of polymeric material secured to said first lamina having an outer surface and an inner surface;
   an antenna for receiving said electromagnetic signal located between said laminae; and circuitry imprinted on the inner surface of one of said laminae coupled to said antenna for generating said identification signal in response to said electromagnetic signal received by said antenna, and said reader being responsive to said identification signal.

7. The identification wristband of claim 6 wherein portions of said circuitry are defined by a conductive ink pattern disposed on said one of said laminae.

8. The identification wristband of claim 6 wherein said circuitry is defined by polymeric conductive patterns on said one of said laminae.

9. In an information transmitting and receiving system, the combination of:

a reader for emitting an electromagnetic signal;

an identification wristband for receiving said electromagnetic signal and producing a responsive identification signal, said wristband including:

a first polymeric material lamina;

a second polymeric material lamina; and a third intermediate polymeric material lamina interposed between said first and second laminae, said first, second, and third laminae being secured to one another;

an antenna for receiving said electromagnetic signal included between two of said laminae;

circuitry between said laminae coupled to said antenna for generating said identification signal in response to said electromagnetic signal received by said antenna; and said reader being responsive to said identification signal.

10. The identification wristband of claim 9 wherein portions of said circuitry are defined by a conductive ink pattern deposited on said third intermediate lamina.

11. The identification wristband of claim 9 wherein portions of said circuitry are defined by polymeric conductors on said third intermediate lamina.

12. In a method of fabricating a wristband for producing a radio frequency identification signal, the steps of:

dispensing a continuous first lamina of polymeric material having an outer surface and an inner surface;

imprinting an RFID circuit on said inner surface of said first lamina;

depositing an antenna on said first lamina connected to said RFID circuit;

imprinting a second polymeric lamina having an outer surface and an inner surface over said RFID circuit and securing it to said first lamina and encapsulating said RFID circuit and said antenna between said first and second laminae.

13. The method of claim 12 in which said RFID circuit is provided by conductive ink on said first lamina.

14. The method of claim 12 wherein said RFID circuit is provided by polymeric conductor means on said first lamina.

15. The method of forming an identification wristband for producing a radio frequency identification signal, said method including the steps of:

dispensing an intermediate polymeric lamina;

depositing an RFID circuit including an antenna on said intermediate lamina;

securing a top polymeric lamina to said intermediate lamina in overlying relationship with said RFID circuit; and securing a bottom polymeric lamina in underlying relationship with said intermediate lamina to encapsulate said intermediate lamina, and forming the configuration of said wristband on said laminae to permit the separation of said wristband therefrom.

\* \* \* \* \*

US005973600C1

(12) EX PARTE REEXAMINATION CERTIFICATE (8437th)
United States Patent
Mosher, Jr.

(10) Number: US 5,973,600 C1
(45) Certificate Issued: Aug. 2, 2011

(54) LAMINATED RADIO FREQUENCY IDENTIFICATION DEVICE

(75) Inventor: Walter W. Mosher, Jr., West Hills, CA (US)

(73) Assignee: Wells Fargo Bank, National Association, Woodland Hills, CA (US)

Reexamination Request:
No. 90/009,548, Sep. 3, 2009

Reexamination Certificate for:
Patent No.: 5,973,600
Issued: Oct. 26, 1999
Appl. No.: 09/149,984
Filed: Sep. 9, 1998

Related U.S. Application Data

(60) Provisional application No. 60/058,653, filed on Sep. 11, 1997.

(51) Int. Cl.
*G08B 13/181* (2006.01)

(52) U.S. Cl. ............... 340/572.8; 340/572.1; 340/573.1; 340/573.4

(58) Field of Classification Search .................. None
See application file for complete search history.

(56) References Cited

U.S. PATENT DOCUMENTS 5,448,110 A 9/1995 Tuttle et al.
5,512,879 A 4/1996 Stokes

*Primary Examiner* — My-Trang Nu Ton

(57) ABSTRACT

An RFID wristband incorporates identification circuitry which may be of a read only, a read/write, a passive, or an active configuration. The wristband consists of a plurality of laminae which bear components of the RFID circuitry and which encapsulate said circuitry upon the securement or adherence of said laminae to each or one another. The wristband is incorporated in an identification system particularly adapted for hospital patient identification and is associated with an RFID reader which generates a magnetic signal requesting identification from the wristband. The wristband is automatically assembled by the utilization of at least two laminae of a polymorphic flexible nature to encapsulate the RFID circuit and includes the utilization of polymeric in conductive components in said circuit. The method of assembling the RFID components with the respective laminae results in the complete isolation of the RFID circuit from contact with deleterious and corrosive substances characteristic of hospital environments.

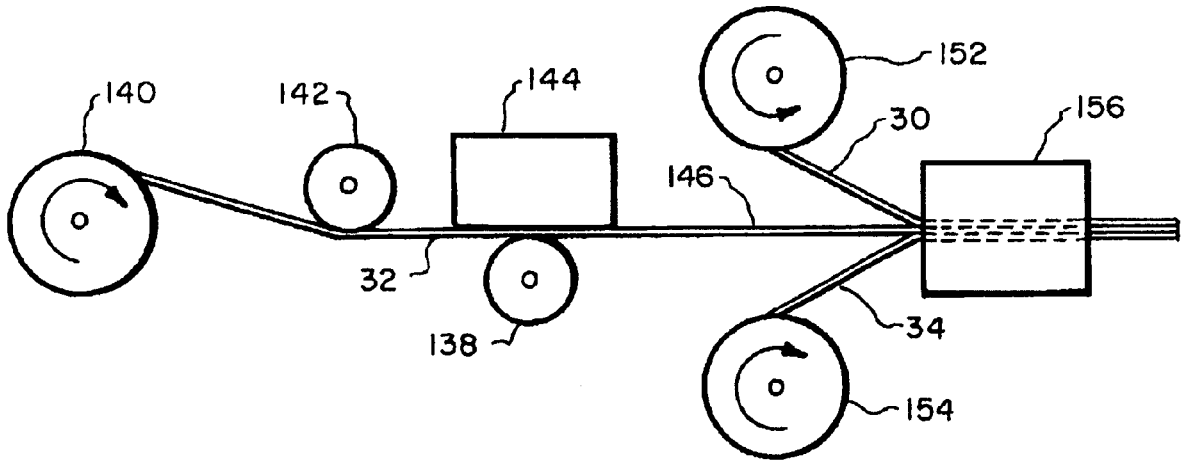

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-6, 8-9, 11-12 and 14-15 are determined to be patentable as amended.

Claims 7, 10 and 13, dependent on an amended claim, are determined to be patentable.

1. In an identification wristband for emitting a radio frequency identification signal, the combination of:
    a first flexible polymer lamina having an outer surface and an inner surface;
    a second flexible polymer lamina having an outer surface and an inner surface;
    programmable encoder circuitry imprinted *by conductive ink* on the inner surface of one of said laminae for defining identification information;
    an antenna imprinted *by conductive ink* on and encapsulated between said laminae; and
    signal generator circuitry imprinted *by conductive ink* on the inner surface of one of said laminae and responsive to said encoder circuitry for applying a radio frequency signal bearing said identification information to said antenna and said laminae being secured to each other to encapsulate said circuitry.

2. In an identification wristband for emitting a radio frequency identification signal, the combination of:
    a first flexible polymer;
    a second flexible polymer;
    programmable encoder circuitry imprinted *by conductive ink* on and encapsulated between said laminae for defining identification information;
    an antenna imprinted *by conductive ink* on and encapsulated between said laminae; and
    a signal generator circuitry imprinted on and encapsulated by said laminae and responsive to said encoder circuitry for applying a radio frequency signal bearing said identification information to said antenna formed of polymer materials imprinted on one of said laminae.

3. In an identification wristband for emitting a radio frequency identification signal, the combination of:
    a first flexible polymer lamina;
    a second flexible polymer lamina;
    programmable encoder circuitry encapsulated between said laminae for defining identification information;
    an antenna encapsulated between said laminae; and
    a signal generator circuitry encapsulated by said laminae and responsive to said encoder circuitry for applying a radio frequency signal bearing said identification information to said antenna; and
    a third intermediate lamina located between said first and second laminae, said intermediate lamina having said circuitry imprinted, *in part, by conductive ink* thereupon in conjunction with said antenna and encapsulated between said first and second laminae.

4. The identification wristband of claim 3 wherein said circuitry is formed of polymeric materials imprinted *by conductive ink* on said third intermediate lamina.

5. In an identification wristband for emitting a radio frequency identification signal, the combination of:
    a first flexible polymer lamina;
    a second felxible polymer lamina;
    programmable encoder circuitry encapsulated between said laminae for defining identification information;
    an antenna encapsulated between said laminae;
    a signal generator circuitry encapsulated by said laminae and responsive to said encoder circuitry for applying a radio frequency signal bearing said identification information to said antenna; and
    said circuitry being imprinted, *in part, by conductive ink* on an IC chip deposited on an intermediate third lamina and encapsulated between said first and second laminae.

6. In a system for providing identification information, the combination of:
    a reader for emitting an electromagnetic signal;
    an identification wristband responsive to said electromagnetic signal by producing an identification signal, said wristband including:
        a first lamina of polymeric material having an outer surface and an inner surface;
        a second lamina of polymeric material secured to said first lamina having an outer surface and an inner surface;
        an antenna for receiving said electromagnetic signal imprinted *by conductive ink* on and located between said laminae; and
        circuitry imprinted, *in part, by conductive ink* on the inner surface of one of said laminae coupled to said antenna for generating said identification signal in response to said electromagnetic signal received by said antenna, and said reader being responsive to said identification signal.

8. The identification wristband of claim 6 wherein said circuitry is defined by polymeric conductive patterns imprinted *by conductive ink* on said one of said laminae.

9. In an information transmitting and receiving system, the combination of:
    a reader for emitting an electromagnetic signal;
    an identification wristband for receiving said electromagnetic signal and
    producing a responsive identification signal, said wristband including:
        a first polymeric material lamina;
        a second polymeric material lamina; and
        a third intermediate polymeric material lamina interposed between said first and second laminae, said first, second, and third laminae being secured to one another;
        an antenna for receiving said electromagnetic signal imprinted *by conductive ink* on and included between two of said laminae;
        circuitry imprinted, *in part, by conductive ink* on and between said laminae coupled to said antenna for generating said identification signal in response to said electromagnetic signal received by said antenna; and said reader being responsive to said identification signal.

11. The identification wristband of claim 9 wherein portions of said circuitry are defined by polymeric conductors imprinted *by conductive ink* on said third intermediate lamina.

12. In a method of fabricating a wristband for producing a radio frequency identification signal, the steps of:
dispensing a continuous first lamina of polymeric material having an outer surface and an inner surface;
imprinting, *in part, by conductive ink* an RFID circuit on said inner surface of said first lamina;
depositing by *conductive ink* imprinting an antenna on said first lamina connected to said RFID circuit;
dispensing a second polymeric lamina having an outer surface and an inner surface over said RFID circuit and securing it to said first lamina and encapsulating said RFID circuit and said antenna between said first and second laminae.

14. The method of claim 12 wherein said RFID circuit is provided by polymeric conductor means *imprinted* on said first lamina.

15. The method of forming an identification wristband for producing a radio frequency identification signal, said method including the steps of:
dispensing an intermediate polymeric lamina;
imprinting, *in part, by conductive ink* an RFID circuit including an antenna on said intermediate lamina;
securing a top polymeric lamina to said intermediate lamina in overlying relationship with said RFID circuit; and
securing a bottom polymeric lamina in underlying relationship with said intermediate lamina to encapsulate said intermediate lamina, and forming the configuration of said wristband on said laminae to permit the separation of said wristband therefrom.

* * * * *